(12) United States Patent
Nishitani et al.

(10) Patent No.: US 7,138,294 B2
(45) Date of Patent: Nov. 21, 2006

(54) CIRCUIT SUBSTRATE DEVICE, METHOD FOR PRODUCING THE SAME, SEMICONDUCTOR DEVICE AND METHOD FOR PRODUCING THE SAME

(75) Inventors: Yuji Nishitani, Kanagawa (JP); Tsuyoshi Ogawa, Kanagawa (JP); Hiroshi Asami, Shizuoka (JP); Akihiko Okubora, Kanagawa (JP)

(73) Assignee: Sony Corporation, Tokyo (JP)

( * ) Notice: Subject to any disclaimer, the term of this patent is extended or adjusted under 35 U.S.C. 154(b) by 44 days.

(21) Appl. No.: 10/792,447

(22) Filed: Mar. 3, 2004

(65) Prior Publication Data

US 2004/0171190 A1 Sep. 2, 2004

Related U.S. Application Data

(62) Division of application No. 10/397,608, filed on Mar. 26, 2003, now Pat. No. 6,831,357.

(30) Foreign Application Priority Data

Apr. 8, 2002 (JP) ............................. 2002-105549

(51) Int. Cl.
*H01L 21/44* (2006.01)
(52) U.S. Cl. ...................... 438/107; 438/108; 438/118
(58) Field of Classification Search ............... 438/107, 438/108, 110, 113, 114, 118, 119, 455, 458, 438/459, 464
See application file for complete search history.

(56) References Cited

U.S. PATENT DOCUMENTS

| 4,306,925 | A  | * | 12/1981 | Lebow et al. ................ 156/150 |
| 6,294,407 | B1 | * | 9/2001 | Jacobs ......................... 438/118 |
| 6,521,530 | B1 | * | 2/2003 | Peters et al. ................ 438/108 |
| 6,737,300 | B1 | * | 5/2004 | Ding et al. ................. 438/110 |
| 2002/0171157 | A1 | * | 11/2002 | Soga et al. ................. 257/783 |

\* cited by examiner

*Primary Examiner*—Kevin M. Picardat
(74) *Attorney, Agent, or Firm*—Robert J. Depke; Rockey, Depke, Lyons & Kitzinger LLC

(57) ABSTRACT

A circuit substrate device composed of a circuit unit 2 and a multi-layer wiring substrate 3 in which a pattern conductor of the circuit unit 2 may be prevented from being warped or inundated. The circuit substrate device includes a circuit unit 2 having a pattern conductor formed by a thin film technique, and an insulating layer, and a multi-layer wiring substrate 3 having a connecting terminal portion 14 exposed from its major surface. The circuit unit is formed on a dummy substrate. The circuit unit is connected to the multi-layer wiring substrate 3 so that the pattern conductor is connected to the connecting terminal portion 14. The dummy substrate is then removed to give a structure comprised of the circuit unit 2 formed on the multi-layer wiring substrate 3. The pattern conductor of the circuit unit 2 is freed of warping or inundations along the direction of thickness of the circuit unit 2.

20 Claims, 8 Drawing Sheets

CIRCUIT SUBSTRATE DEVICE, METHOD FOR PRODUCING THE SAME, SEMICONDUCTOR DEVICE AND METHOD FOR PRODUCING THE SAME

The subject matter of application Ser. No. 10/397,608 is incorporated herein by reference. The present application is a divisional of U.S. application Ser. No. 10/397,608, filed Mar. 26, 2003 now U.S. Pat. No. 6,831 357, which claims priority to Japanese Patent Application No. JP2002-105549, filed Apr. 8, 2002. The present application claims priority to these previously filed applications.

BACKGROUND OF THE INVENTION

1. Field of the Invention

This invention relates to a circuit substrate device, on which a pattern conductor has been formed properly, a method for producing the same, a semiconductor device, and a method for producing the same. This application claims priority of Japanese Patent Application No. 2002-105549, filed on, 2002, the entirety of which is incorporated by reference herein.

2. Description of Related Art

Recently, there is raised a demand for a technique of mounting functional elements, such as semiconductor chips, on e.g., a substrate, to a high density, for keeping up to the reduction in size and thickness, and to the advanced and diversified functions of electronic equipment. These functional elements are mounted on the substrate in the form of a mold package, such as QFP (Quad Flat Package) or a SOP (Small Outline Package), a package of a smaller size, such as BGA (Ball Grid Array) or CSP (Chip Scale Package), or MCM (multi-chip module), for mounting plural semiconductor chips.

In the mounting configuration for the functional elements, such as BGA, CSP or MCM, a semiconductor chip is mounted on a wiring substrate by pair-chip mounting, and an electrode land is arranged on a surface of the wiring substrate opposite to the surface thereof mounting the wiring substrate. The electrode land is used as a connection terminal to a motherboard.

As a substrate for mounting the semiconductor chip, a wiring substrate of an organic material, such as a glass epoxy substrate or a polyimide substrate, or a wiring substrate of an inorganic material, such as ceramics substrate. In particular, as the wiring substrate of an organic material, used for mounting a semiconductor chip having a large number of connecting terminals, such as connection pins, or used for MCM mounting, a multi-layer wiring substrate 100, or a so-called FR (flame-retardant) substrate, is used, as shown in FIG. 1. This multi-layer wiring substrate 100 includes a via-hole 102, with a diameter on the order of 50 μm, for interconnecting multi-layered pattern conductors 101 by for example laser processing. With this multi-layer wiring substrate 100, the line width of the pattern conductor 101 can be as fine as approximately 100 μm.

However, with the above-described multi-layer wiring substrate 100, there is raised, in keeping up with the tendency towards an increased number of the semiconductor chips and a decreased pitch between the connection pins, a demand for increasing the density of the pattern conductors 101 on the surface of the multi-layered pattern conductors 101 mounting the semiconductor chip. Since the number of the lines in the semiconductor chip for MCM mounting in near future amounts to several thousands or to several tens of thousands, it is required to raise the density of the pattern conductors 101 further.

If, in the present multi-layer wiring substrate 100, plural semiconductor chips are connected to a large number of conductor patterns, it becomes necessary to increase the mounting area or to increase the number of layers of the pattern conductors 101. With the multi-layer wiring substrate 100, the line length of the pattern conductors 101 in increased, while the number of the via-holes 102 is increased with increasing numbers of the via-holes, with the consequence that the numbers of the C, L and R components in the pattern conductors 101 may be increased to deteriorate electrical characteristics.

Moreover, in producing the multi-layer wiring substrate 100, the manufacturing process may be complex with the increasing number of the layers of the pattern conductors 101 to increase the production time or to lower the production efficiency.

On the other hand, a wiring substrate of an inorganic material, such as Si substrates or glass substrates, may also be used in place of the multi-layer wiring substrate 100. Since these Si or glass substrates are superior in surface smoothness and in thermal resistance, pattern conductors may be formed on its mounting surface for semiconductor chips, by employing for example the thin film forming technique, to a finer line width than is possible with the above-described multi-layer wiring substrate 100.

However, with the Si substrate or the glass substrate, it is difficult to form e.g., via-holes, such that electrode lands, operating as connection terminals for a motherboard, cannot be formed on a surface on the opposite side of the mounting surface for the semiconductor chip, with the consequence that these substrates cannot be used as mounting substrates for the semiconductor chips.

SUMMARY OF THE INVENTION

It is therefore an object of the present invention to provide a circuit substrate device and a semiconductor device superior in electrical properties and in high frequency characteristics and which may prohibit the production time and production cost from being increased while prohibiting the production efficiency from being lowered. It is another object of the present invention to provide a method for producing the circuit substrate device and a method for producing a semiconductor device.

In one aspect, the present invention provides a circuit substrate device including a circuit unit having one or more wiring layers each having a pattern conductor formed by a thin film technique, and an insulating layer, the circuit unit also having a land unit, on an uppermost layer of the wiring layer(s), the land unit connecting to the pattern conductor, and a multi-layer wiring substrate including a connecting portion exposed from a major surface thereof. The circuit unit is formed through a release layer on a dummy substrate, having a flattened out surface, while the circuit unit is connected to the major surface of the multi-layer wiring substrate so that the land unit is connected to the connecting portion. The dummy substrate and the release layer are removed by peeling at the release layer to give a structure comprised of the circuit unit formed on the major surface of the multi-layer wiring substrate.

This circuit substrate device is formed by forming a circuit unit on a dummy substrate with a planar surface, with the interposition of a release layer, and by peeling off the dummy substrate and the release layer after the circuit unit having a pattern conductor is attached to the major surface of the multi-layer wiring substrate. With this circuit substrate device, since the waprin or the inundations of the circuit unit along the direction fo thickness may be suppressed, the circuit unit having the fine pattern conductor formed to high accuracy may be formed on the the major surface of the multi-layer wiring substrate.

In still another aspect, the present invention provides a method for producing a circuit substrate device comprising a circuit unit forming step of forming a circuit unit through a release layer, with the circuit unit having one or more wiring layers each having a pattern conductor formed by a thin film technique, and an insulating layer, with the circuit unit also having a land unit, on an uppermost layer of the wiring layer(s), connecting to the pattern conductor, a substrate forming step of forming a multi-layer wiring substrate including a connecting portion exposed from a major surface thereof, a bonding step of connecting the circuit unit to the major surface of the multi-layer wiring substrate for connecting the land unit to the connecting portion, and a removing step of removing the dummy substrate and the release layer by releasing the release layer from the circuit unit.

In this method for producing a circuit substrate device, the circuit substrate device is formed by forming a circuit unit on a dummy substrate with a planar surface, with the interposition of a release layer, and by peeling off the dummy substrate and the release layer after the circuit unit having a pattern conductor is attached to the major surface of the multi-layer wiring substrate. With this circuit substrate device, since the warping or the inundations of the circuit unit along the direction fo thickness may be suppressed, the circuit unit having the fine pattern conductor formed to high accuracy may be formed on the major surface of the multi-layer wiring, substrate.

In still another aspect, the present invention provides a method for producing a circuit substrate device comprising a circuit set forming step of forming a set of circuits, composed of a plurality of circuit units arrayed side by side, via a release layer, each circuit unit having one or more wiring layers each having a pattern conductor formed by a thin film technique, and an insulating layer, with the circuit unit also having a land unit, on an uppermost layer of the wiring layer(s), connecting to the pattern conductor, an inspecting step of subjecting the set of circuits to preset inspection as to whether or not the pattern conductor has been properly formed, from one circuit unit to another, a splitting step of splitting the dummy substrate and the set of circuits, as the set of circuits has been formed on the dummy substrate, from one circuit unit to another, a sorting step of accepting only the circuit unit the pattern conductor of which has been found in the inspecting step to have been formed properly, a substrate forming step of forming a multi-layer wiring substrate including a connecting portion exposed from a major surface thereof, a bonding step of bonding the circuit unit, accepted in the inspecting step, to the major surface of the multi-layer wiring substrate so that the land unit is bonded to the major surface of the multi-layer wiring substrate, and a removing step of removing the dummy substrate and the release layer by peeling at the release layer from the circuit unit.

With this method for producing a circuit substrate device, it is checked in the inspecting step whether or not the pattern conductor is properly formed, from one circuit unit of the circuit set to another, and only the circuit unit the pattern conductor of which has been formed properly is selected in the sorting step, so that only the circuit unit which is not defective may be connected to the multi-layer wiring substrate, thus improving the production efficiency.

Moreover, since the dummy substrate is removed after bonding the circuit unit to the multi-layer wiring substrate, a circuit substrate device may be produced which has a fine pattern conductor of a high accuracy freed of warping or inundations in the direction of thickness on the major surface of the multi-layer wiring substrate.

In still another aspect, the present invention provides a method for producing a circuit substrate device comprising a circuit set forming step of forming a set of circuits, comprised of a plurality of circuit units arrayed side by side, through a release layer, each circuit unit having one or more wiring layers each having a pattern conductor formed by a thin film technique, and an insulating layer, with the circuit unit also having a land unit, on an uppermost layer of the wiring layer(s), connecting to the pattern conductor, a substrate set forming step of forming a set of a plurality of multi-layer wiring substrates arrayed side by side in a facing relationship to the circuit units of the circuit set, each multi-layer wiring substrate including a connecting portion exposed from the major surface thereof, a bonding step of bonding the circuit set to the substrate set so that the land unit of the circuit unit is connected to the connecting portion of the multi-layer wiring substrate lying in a facing relationship to the land unit, a removing step removing the dummy substrate and the release layer by peeling the release layer from the circuit set, and a splitting step of splitting the circuit set and the substrate set in a lump, as the circuit set and the substrate set are bonded to each other, from one circuit unit to another.

With this method for producing a circuit substrate device, the circuit set and the substrate set are bonded together in the bonding step, and the dummy substrate is removed in the removing step, after which the resulting assembly is split in the splitting step, on the circuit unit basis, with the circuit set and the substrate set remaining attached to each other. Thus, plural circuit substrate devices may be produced in a lump thus improving the production efficiency and decreasing the time needed in production.

Moreover, in this method for producing a circuit substrate device, in which the dummy substrate is removed after bonding the circuit set to the substrate set, a circuit substrate device may be produced which has a fine pattern conductor of a high accuracy freed of warping or inundations in the direction of thickness on the major surface of the multi-layer wiring substrate.

In still another aspect, the present invention provides a method for producing a circuit substrate device comprising a circuit set forming step of forming a set of circuits, comprised of a plurality of circuit units arrayed side by side, via a release layer, each circuit unit having one or more wiring layers each having a pattern conductor formed by a thin film technique, and an insulating layer, with the circuit unit also having a land unit, on an uppermost layer of the wiring layer(s), for connecting to the pattern conductor, an inspecting step of subjecting the set of circuits to preset inspection as to whether or not the pattern conductor has been properly formed, from one circuit unit to another, a substrate forming step of forming a multi-layer wiring substrate including a connecting portion exposed from a major surface thereof, a bonding step of bonding the multi-layer wiring substrate only to the circuit unit, the pattern conductor of which has been found in the inspecting step to have been formed properly, so that the land unit is connected to the connecting portion, a removing step of removing the dummy substrate and the release layer so that the release layer is peeled from the circuit set, and a splitting step of splitting the circuit set into the circuit units as the multi-layer wiring substrate is attached thereto.

With the present method for producing a circuit substrate device, it is checked in the inspection step whether or not the pattern conductor has been properly formed, from one circuit unit of the circuit set to another, the multi-layer wiring substrate is bonded in the bonding step only to the circuit unit(s) of the circuit set, the pattern conductor of which has been formed properly, the dummy substrate is removed in the removing step and subsequently the resulting circuit substrate device is split in the splitting step, as the circuit set and the substrate set are bonded together, on the circuit unit basis. Thus, a plural number of the circuit substrate devices, comprised of the satisfactory circuit units and the multi-layer wiring substrates, bonded thereto, may be prepared in a lump, thereby appreciably improving the production efficiency and decreasing the production time.

Moreover, with the present method for producing a circuit substrate device, since the dummy substrate is removed after bonding the circuit set to the multi-layer wiring substrate, a circuit substrate device may be produced having a circuit unit formed on the major surface of the multi-layer wiring substrate having a pattern conductor formed on its major surface to a fine line width and high accuracy in a manner free of warping or inundations in the direction of thickness In still another aspect, the present invention provides a semiconductor device comprising a circuit substrate unit including a circuit unit having one or more wiring layers each having a pattern conductor formed by a thin film technique, and an insulating layer, with the circuit unit also having a land unit, on an uppermost layer of the wiring layer(s), connecting to the pattern conductor, with the circuit substrate also including a multi-layer wiring substrate, including in turn a connecting portion exposed from a major surface thereof, and a semiconductor chip mounted on the circuit substrate unit by being electrically connected to the pattern conductor. The circuit substrate unit is so formed that the circuit unit is formed via a release layer on a dummy substrate, having a flattened out surface. The circuit unit is bonded to the major surface of the multi-layer wiring substrate so that the land unit is connected to the connecting portion, the dummy substrate and the release layer being then removed by peeling at the release layer to form the circuit unit on the major surface of the multi-layer wiring substrate.

In this semiconductor device, the circuit unit is formed on the dummy substrate, having a flattened out surface, with the interposition of a release layer, and a circuit unit, having a pattern conductor by a thin film technique, bonded to the major surface of the multi-layer wiring substrate, after which the dummy substrate and the release layer are removed to form the circuit substrate unit. Thus, with the present semiconductor device, since the warping or inundations along the thickness of the circuit unit in the circuit wiring substrate may be suppressed, the circuit unit having a pattern conductor of a fine line width may be formed to high accuracy on the major surface of the multi-layer wiring substrate.

In still another aspect, the present invention provides a method for producing a semiconductor device comprising-a circuit substrate unit forming step of forming a circuit substrate unit by a circuit unit forming step of forming a circuit unit through a release layer, with the circuit unit having one or more wiring layers each having a pattern conductor formed by a thin film technique, and an insulating layer, with the circuit unit also having a land unit, on an uppermost layer of the wiring layer(s), connecting to the pattern conductor, a substrate forming step of forming a multi-layer wiring substrate including a connecting portion exposed from a major surface thereof, a bonding step of bonding the circuit unit to the major surface of the multi-layer wiring substrate for connecting the land unit to the connecting portion, and a removing step of removing the dummy substrate and the release layer by releasing the release layer from the circuit unit, and a mounting step of electrically connecting the pattern conductor to a semiconductor chip for mounting the semiconductor chip.

With the present method for producing a semiconductor device, the circuit unit is formed on the dummy substrate, having a flattened out surface, with the interposition of a release layer and, after bonding the circuit unit, having the pattern conductor by a thin film technique, to the major surface of the multi-layer wiring substrate, the dummy substrate and the release layer are removed to form the circuit substrate unit. Thus, with the present method for producing the semiconductor device, such a semiconductor device may be produced including a circuit substrate unit having a circuit unit on the major surface of the multi-layer wiring substrate, with the pattern conductor being free from warping or inundations along the thickness and being formed to fine line width and to high accuracy.

In still another aspect, the present invention provides a method for producing a semiconductor device comprising a circuit substrate forming step of forming circuit substrate by circuit set forming step of forming a set of circuits, comprised of a plurality of circuit units arrayed side by side, via a release layer, each circuit unit having one or more wiring layers each having a pattern conductor formed by a thin film technique, and an insulating layer, with the circuit unit also having a land unit, on an uppermost layer of the wiring layer(s), connecting to the pattern conductor, an inspecting step of subjecting the set of circuits to preset inspection as to whether or not the pattern conductor has been properly formed, from one circuit unit to another, a splitting step of splitting the dummy substrate and the set of circuits, as the set of circuits has been formed on the dummy substrate, from the circuit unit to another, a sorting step of accepting only the circuit set the pattern conductor of which has been found in the inspecting step to have been formed properly, a substrate forming step of forming a multi-layer wiring substrate including a connecting portion exposed from a major surface thereof, a bonding step of bonding the circuit unit, accepted in the inspecting step, to the major surface of the multi-layer wiring substrate so that the land unit is bonded to the connecting portion, and a removing step removing the dummy substrate and the release layer by peeling at the release layer, and a mounting step of mounting the semiconductor chip on the circuit substrate by electrically connecting the pattern conductor to the semiconductor chip.

With the present method for producing this semiconductor device, it is checked in the circuit substrate forming step whether or not the pattern conductor has been formed properly, from one circuit unit of the circuit set to another, and only the circuit unit, the pattern conductor of which has been formed properly, is accepted in the sorting step, such a circuit substrate unit, composed of the multi-layer wiring substrate bonded to only a satisfactory circuit unit, is produced, thus improving the production efficiency.

Moreover, with the present method for producing this semiconductor device, the dummy substrate is removed after bonding the circuit unit to the multi-layer wiring substrate, in the circuit substrate forming step, such a semiconductor device may be produced including a circuit substrate unit having a circuit unit on the major surface of the multi-layer wiring substrate, with the pattern conductor being free from warping or inundations along the thickness and being formed to fine line width and to high accuracy.

In still another aspect, the present invention provides a method for producing a semiconductor device comprising a circuit substrate forming step of forming a set of circuits, comprised of a plurality of circuit units arrayed side by side, via a release layer, each circuit unit having one or more wiring layers each having a pattern conductor formed by a thin film technique, and an insulating layer, with the circuit unit also having a land unit, on an uppermost layer of the wiring layers, connecting to the pattern conductor, a substrate set forming step of forming a set of a plurality of multi-layer wiring substrates arrayed side by side in a facing relationship to the circuit units of the circuit set, with each multi-layer wiring substrate including a connecting portion exposed from the major surface thereof, a bonding step of bonding the circuit set to the substrate set so that the land unit of the circuit unit is connected to the connecting portion of the multi-layer wiring substrate lying in a facing relationship to the land unit, a removing step removing the dummy substrate and the release layer by peeling at the release layer, and a splitting step of splitting the circuit set and siad substrate set in a lump from one circuit unit to another, and a mounting step of mounting the semiconductor chip on the circuit substrate by electrically connecting the pattern conductor to the semiconductor chip.

With the present method for producing the semiconductor device, the circuit set and the substrate set are bonded together in the bonding step in the circuit substrate unit forming step in a lump, and the dummy substrate is removed in the removing step, after which the circuit substrate unit is split in the splitting step on the circuit unit basis, with the circuit set and the substrate set remaining bonded to each other, so that a plural number of the circuit substrate units may be produced in a lump, thus improving the production efficiency and decreasing the production time.

Moreover, with the present method for producing the semiconductor device, since the dummy substrate is removed after bonding the circuit unit to the substrate unit, such a semiconductor device may be produced including a circuit substrate unit having a circuit unit on the major surface of the multi-layer wiring substrate, with the pattern conductor being free from warping or inundations along the thickness and being formed to fine line width and to high accuracy.

In yet another aspect, the present invention provides a method for producing a semiconductor device comprising a circuit substrate forming step of forming a set of circuits, comprised of a plurality of circuit units arrayed side by side, via a release layer, each circuit unit having one or more wiring layers each having a pattern conductor formed by a thin film technique, and an insulating layer, with the circuit unit also having a land unit, on an uppermost layer of the wiring layers, connecting to the pattern conductor, an inspecting step of subjecting the set of circuits to preset inspection as to whether or not the pattern conductor has been properly formed, from one circuit unit to another, a substrate forming step of forming a multi-layer wiring substrate including a connecting portion exposed from the major surface, a bonding step of bonding the multi-layer wiring substrate only to the circuit unit the pattern conductor of which has been found in the inspection step to have been formed properly, so that the land is connected to the connecting portion, a removing step of removing the dummy substrate and the release layer by peeling the release layer from the circuit set, and a splitting step of splitting the set of circuits, as the set of circuits has been bonded to the multi-layer wiring substrate, into the circuit units, and a mounting step of mounting the semiconductor chip on the circuit substrate by electrically connecting the pattern conductor to the semiconductor chip.

With the present method for producing a semiconductor device, it is checked in the inspection step, whether or not the pattern conductor has been formed properly, from one circuit unit of the circuit set to another, and the multi-layer wiring substrate is bonded in the bonding step only to the circuit unit of the circuit set where the pattern conductor has been formed properly. After the dummy substrate has been removed in the removing step, the resulting circuit substrate set is split in the splitting step, on the circuit unit basis, with the circuit set remaining attached to the multi-layer wiring substrate, whereby a plural number of the circuit substrates, each composed of the multi-layer wiring substrate bonded to the satisfactory circuit unit, may be produced in a lump, thus improving the production efficiency and decreasing the production time appreciably.

Additionally, with the present method for producing a semiconductor device, in which the dummy substrate is removed after bonding the multi-layer wiring substrate to the circuit set, such a semiconductor device may be produced including a circuit substrate unit having a circuit unit on the major surface of the multi-layer wiring substrate, with the pattern conductor being free from warping or inundations along the thickness and being formed to fine line width and to high accuracy. With the present invention, a circuit unit is formed via a release layer on a dummy substrate, having a flattened out surface, with the dummy substrate and the release layer being removed after bonding the circuit unit having the pattern conductor by the thin film technique is bonded to the multi-layer wiring substrate. As a result, the circuit substrate device and the semiconductor device, suppressed in warping and inundations along the thickness of the circuit unit, may be produced.

Thus, according to the present invention, the circuit unit, including a pattern conductor, as a fine line formed to a high density and a high accuracy, may be formed on the multi-layer wiring substrate, so that a circuit substrate device, improved in electrical characteristics and reduced in size, and a semiconductor device, having a semiconductor chip mounted on this circuit substrate device, may be produced.

Moreover, according to the present invention, the circuit unit, found to be defective as to the pattern conductor in the inspection step, may be prohibited from being bonded to the multi-layer wiring substrate, so that it is possible to improve the production efficiency and to lower the cost in producing the circuit substrate device or the semiconductor device. Additionally, since plural circuit substrate devices can be formed in a lump by employing the circuit set or the substrate set, it is also possible to decrease the production time and to improve the production efficiency in producing the circuit substrate device or the semiconductor device. Since the dummy substrate can be re-used, it is possible to decrease the cost further cost in producing the circuit substrate device or the semiconductor device.

DESCRIPTION OF THE PREFERRED EMBODIMENTS

Figure 1:
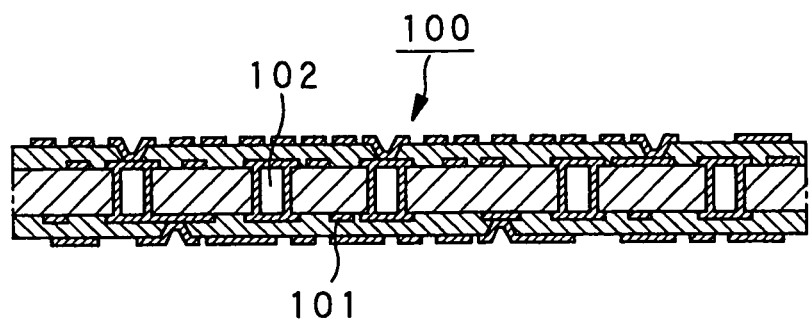
FIG. 1 is a longitudinal cross-sectional view showing a conventional semiconductor device.
Figure 2:
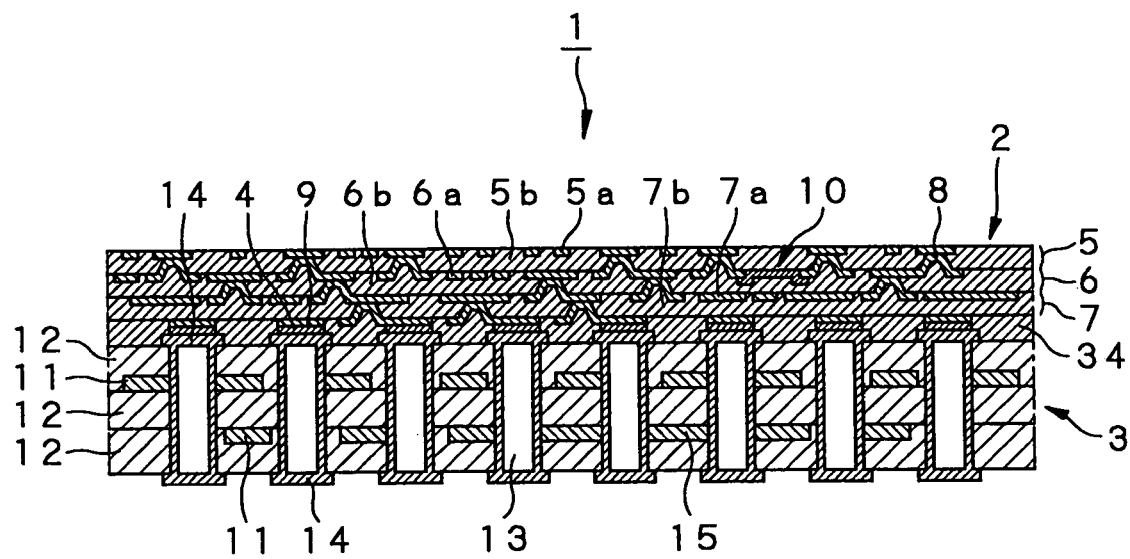
FIG. 2 is a longitudinal cross-sectional view showing a circuit substrate device according to the present invention.

Referring to the drawings, a first embodiment of the present invention will be explained in detail. A circuit substrate device 1, shown as an embodiment in FIG. 2, includes a circuit unit 2, electrically connected to a multi-layer wiring substrate 3 by for example a bump unit 4, such as solder. The circuit unit 2 operates as a high frequency circuit performing e.g., a switching operation for high frequency signals, in a superheterodyne system or a direct conversion system, in a transmitting/receiving unit provided in e.g., a portable, communication terminal equipment.

The circuit unit 2 is made up by a first unit wiring layer 5, a second unit wiring layer 6 formed on the major surface of the first unit wiring layer and a third unit wiring layer 7 formed on the major surface of the a second unit wiring layer 6. Each of the layers 5 to 7 is composed of an insulating layer and a pattern conductor.

The layers 5 to 7 of the circuit unit 2 are electrically interconnected by a via-hole 8 traversing the upper and lower surfaces of the respective layers. Moreover, in the circuit unit 2, there are formed a plural number of lands 9, electrically interconnecting the pattern conductors, on the surface of the third unit wiring layer 7 opposite to the first unit wiring layer 5. Each land 9 operates as a base of the bump unit 4 in bonding the circuit unit 2 to the circuit substrate device 3.

The circuit unit 2 may be formed by forming the layers 5 to 7 on the highly flattened major surface of, for example, a dummy substrate, as later explained, using e.g., a thin-film forming technique. Thus, in this circuit unit 2, pattern conductors of the first to third layers 5 to 7 may be formed to high accuracy.

In the circuit unit 2, a passive device 10, exemplified by for example a capacitor, a resistor or an inductor, is formed at a preset position of the patterned wiring of each of the first to third layers 5 to 7. Thus, the circuit unit 2 operates as a high frequency circuit. In the circuit unit 2, in which the first to third layers 5 to 7 are formed on the dummy substrate, the passive device 10 may be formed to high accuracy. Thus, the circuit unit 2, in which a semiconductor chip, for example, is not used as a high frequency circuit, and the passive device 10 is formed to high accuracy as a thin film in each unit wiring layer, may be operated as a small-sized high-performance high frequency circuit.

In the circuit unit 2, the first to third layers 5 to 7 are formed of a material low in dielectric constant and low tanδ, that is superior in high frequency characteristics, for example, an organic-material, exemplified by polyphenylene ether (PPE), bis-maleidotriazine (BT-resin), polytetrafluoroethylene, polyimide, liquid crystal polymer (LCP), polynorbornene (PNB), phenolic resin or polyolefinic resin, an inorganic material, such as ceramics, or a mixture of organic and inorganic materials, such as glass-epoxy.

On the other hand, the multi-layer wiring substrate 3 is a so-called flame-retardant (FR) substrate, in which plural wiring layers 11 are interposed between plural insulating layers 12. These plural wiring layers 11 are interconnected by via-holes 13 through the totality of or plural layers. On the front and rear major surfaces of the multi-layer wiring substrate 3 are formed a plural number of connection terminals 14, these connection terminals 14 operating as connection terminals for external power supply or as base portions of the bump units 4 for bonding the circuit unit 2. Moreover, in the multi-layer wiring substrate 3, the plural wiring layers 11 operate as wiring for transmitting the power supplied from the connection terminals 14, control signals or the high frequency signals, while also operating as grounds (grounding electrodes) 15.

In the multi-layer wiring substrate 3, the insulating layers 12 is formed, similarly to the insulating layers of the circuit unit 2, of an organic material, such as polyphenylene ether (PPE), bis-maleidotriazine (BT-resin), polytetrafluoroethylene, polyimide, liquid crystal polymer (LCP), polynorbornene (PNB), phenolic resin or polyolefinic resin, an inorganic material, such as ceramics, or a mixture of organic and inorganic materials, such as glass-epoxy. The multi-layer wiring substrate 3 is produced by a routine manufacturing process used for producing e.g., FR substrates.

Figure 3:
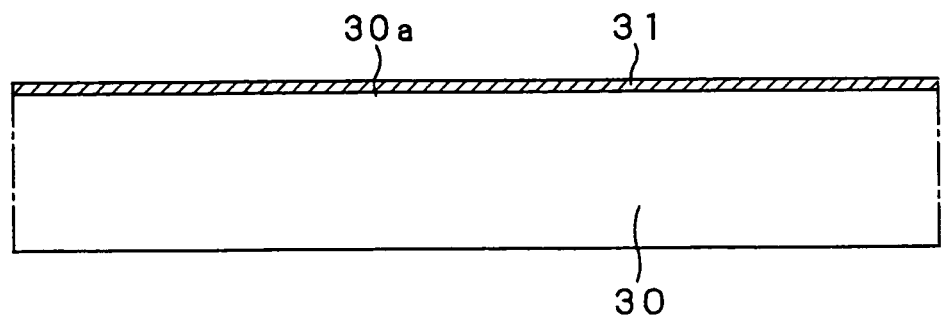
FIG. 3, illustrating the manufacturing process of the circuit substrate device, is a longitudinal cross-sectional view showing a dummy substrate.

The manufacturing process for the circuit substrate device 1 is now explained. For producing the circuit substrate device 1, the circuit unit 2 is prepared first of all. In forming the circuit unit 2, a dummy substrate 30, on a major surface 30a of which a release layer 31 has been formed, is provided, as shown in FIG. 3. As this dummy substrate 30, a glass substrate, a quartz substrate or an Si substrate of a high thermal resistance, having a major surface 30a flattened out to high accuracy, for example, is used. The release layer 31 is constituted by a film of metal, such as copper or aluminum, formed to a uniform thickness of approximately 1000 Å on the entire major surface 30a of the dummy substrate 30 by for example, a sputtering method or a chemical vapor deposition (CVD) method, and a film of resin, such as polyimide resin, on the entire surface of this metal film by for example a spin coating method.

Figure 4:
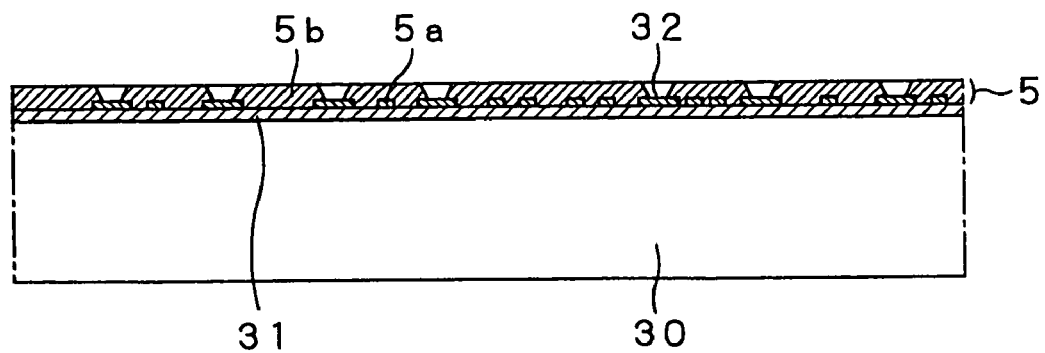
FIG. 4, illustrating the manufacturing process of the circuit substrate device, is a longitudinal cross-sectional view showing a first unit wiring layer formed on a dummy substrate.

On this release layer 31, a first unit wiring layer 5, composed of a first pattern conductor 5a and a first insulating layer 5b, is formed, as shown in FIG. 4. In forming this unit wiring layer 5, a mask having an opening in register with the pattern of the first pattern conductor 5a is first formed on the release layer 31.

On the release layer 31 is then formed a thin metal film to overlie the so formed mask, by a thin film technique, such as, for example, a sputtering method, a CVD method or a plating method. This thin film of metal is of a highly electrically conductive metal, such as copper. The thin metal film is formed to overlie the entire surface of the release layer 31 provided on the mask and the mask opening. If formed by electrolytic plating, the thin metal film is formed by the metal film of the release layer 31 operating as a voltage applying electrode.

The mask formed on the release layer 31 is removed along with the thin metal film formed thereon. Since the first pattern conductor 5a, thus formed, is formed on the highly flattened out major surface 30a of the dummy substrate 30, and thus is freed of warping or inundations along the thickness, the first pattern conductor may be formed of a wire of for example several μm in diameter.

On the release layer 31, the first insulating layer 5b is formed to overlie the first pattern conductor 5a. This first insulating layer 5b is formed using an insulating dielectric material generally known in a conventional wiring substrate manufacturing process. Specifically, the first insulating layer 5b is formed using a material low in dielectric constant and low tanδ, that is superior in high frequency characteristics, for example, an insulating dielectric material, such as polyphenylene ether (PPE), bis-maleidotriazine (BT-resin), a liquid crystal polymer (LCP), polynorbornene (PNB), bismaleidotriazine (BT-resin), polyimide, benzocyclobutene (BCB), an epoxy resin or an acrylic resin. The first insulating layer 5b is formed by coating on the release layer 31, to overlie the first pattern conductor 5a, by for example a spin coating method, a curtain coating method, a roll coating method or a dip coating method.

An opening 32 for exposing the first pattern conductor 5a is formed by patterning processing at a preset position in the first insulating layer 5b. This forms a via 8 in a portion of the first insulating layer 5b where the opening 32 has been formed. Specifically, when a photosensitive insulating dielectric material is used for the first insulating layer 5b, the opening 32 is formed by patterning processing based on the photolithographc technique. When a non-photosensitive insulating dielectric material is used for the first insulating layer 5b, the opening 32 is formed by patterning, based on dry etching or laser processing, using a photoresist or a mask e.g., of aluminum. The first unit wiring layer 5 is formed in this manner on the release layer 31.

Figure 5:
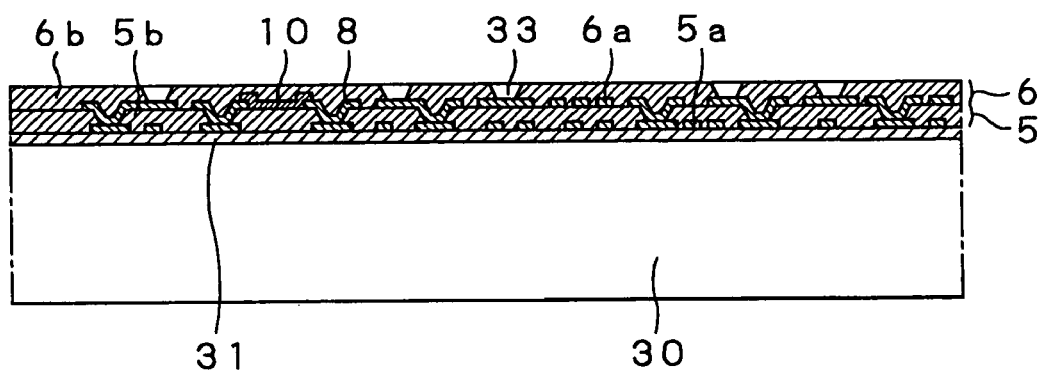
FIG. 5, illustrating the manufacturing process of the circuit substrate device, is a longitudinal cross-sectional view showing a second unit wiring layer formed on the first unit wiring layer.

On the first unit wiring layer 5 is then formed a second unit wiring layer 6, composed of a second pattern conductor 6a and a second insulating layer 6b, as shown in FIG. 5. This second unit wiring layer 6 is formed using a material and a process similar to those used for the first unit wiring layer 5. A passive element unit 10, such as a resister, is formed in a portion of the second unit wiring layer 6.

In forming the second unit wiring layer 6, a mask having an opening in register with a pattern of the second pattern conductor 6a is first formed on the first unit wiring layer 5. On the first unit wiring layer 5, a thin metal film is then formed to overlie the so formed mask, using a thin film technique, such as, for example, a sputtering method, a CVD method or a plating method. The thin metal film is formed of metal having high electrical conductivity, such as copper. The thin metal film is formed to overlie both the entire surface of the first unit wiring layer 5, provided with the mask, and the mask opening. The mask provided to the first unit wiring layer 5 is then removed along with the thin metal film formed on the mask. This forms the second pattern conductor 6a on the first unit wiring layer 5.

On the first unit wiring layer 5, a resistor, for example, is formed as the passive element unit 10 for electrical connection to the second unit wiring layer 6. When forming this passive element unit 10, a tantalum nitride (TaN) film is deposited on the entire surface of the first unit wiring layer 5 for overlying the second pattern conductor 6a. For forming this TaN layer, a sputtering method, capable of forming the film to a film thickness of e.g., approximately 2000 Å, is preferably used. On the TaN layer, there is formed a mask for anodic oxidation of only an area where the passive element unit 10 is to be formed. This causes anodic oxidation of only the portion of the TaN layer exposed to outside through the mask opening.

The portion of the TaN layer exposed to outside through the mask opening is then subjected to anodic oxidation. In this anodic oxidation, a voltage of 50 to 200V is applied in an electrolytic solution of, for example, ammonium borate so that TaN is oxidized to form a layer of tantalum oxide (TaO). Meanwhile, the TaO layer can be formed to a desired thickness by adjusting the voltage applied to the TaN layer.

The mask formed on the TaN layer, already subjected to the anodic oxidation, is then removed. Thus, the TaO layer, obtained on selective oxidation of the surface of the TaN layer, may become the dielectric material of the passive element unit 10. The TaO layer then is dry-etched, as the site of the TaO layer on which to form the passive element unit 10 is masked with e.g., a resist, to remove the mask, to form the resistor as the passive element unit 10.

Similarly to the first pattern conductor 5a, the second pattern conductor 6a and the passive element unit 10, thus formed, are formed on the dummy substrate 30, flattened out to high accuracy, to suppress warping or inundations along the thickness. Thus, the second pattern conductor 6a can be formed to a high accuracy to a line as fine as several μm in width, so that the passive element unit 10 can be formed to high accuracy in a manner free of dimensional error. In particular, since the passive element unit 10 is formed to high accuracy, high frequency characteristics can be improved. Although the resistor is formed as the passive element unit 10, this is not limitative of the present invention, such that an inductor or a capacitor, for example, may be formed as the passive element unit.

The second insulating layer 6b is formed on the first unit wiring layer 5 for overlying the second pattern conductor 6a and the passive element unit 10. This second insulating layer 6b is formed using the material and the manufacturing process similar to those for the first insulating layer 5b. An opening 33, exposing the second pattern conductor 6a, is formed by patterning processing on a preset site of the second insulating layer 6b, as in the case of the first insulating layer 5b. A via 8 is formed on a site of the second insulating layer 6b in register with the opening 33, as in the case of the first unit wiring layer 5. The second unit wiring layer 6 is formed in this manner on the first unit wiring layer 5.

Figure 6:
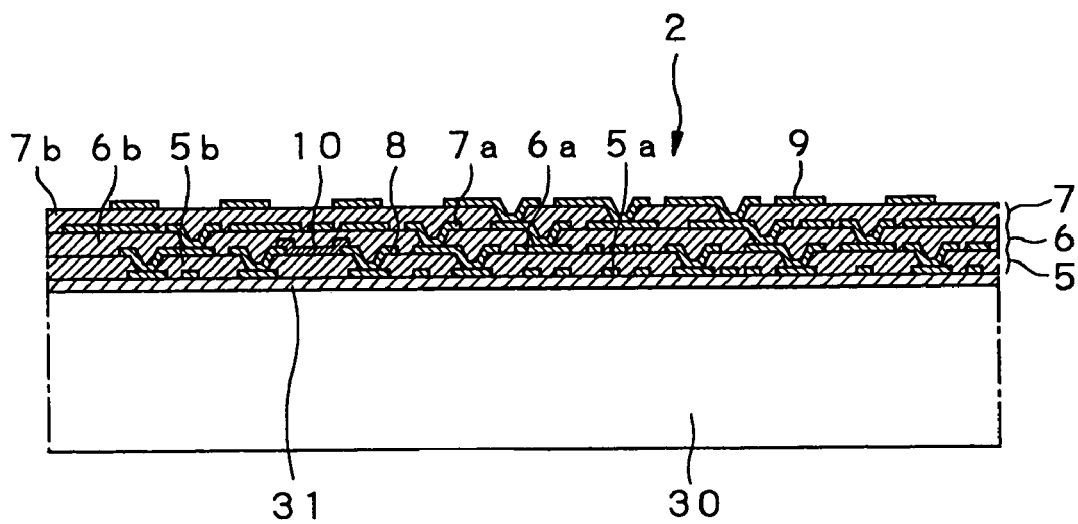
FIG. 6, illustrating the manufacturing process of the circuit substrate device, is a longitudinal cross-sectional view showing a third unit wiring layer formed on the second unit wiring layer.

The third unit wiring layer 7, composed of a third pattern conductor 7a and a third insulating layer 7b, then is formed on the second unit wiring layer 6, as shown in FIG. 6. This third unit wiring layer 7 is formed using the material and the manufacturing process similar to those-used for the first unit wiring layer 5. In this third unit wiring layer 7, formed on the major surface 30a of the dummy substrate 30, flattened out to high accuracy, the third pattern conductor 7a may be freed of warping or inundations along the direction of thickness, and hence may be formed to a line width of, for example the order of several μm.

A land unit 9 then is formed at a preset position on the third unit wiring layer 7. For forming this land unit 9, an opening exposing the third pattern conductor 7a is formed at a preset position of the third insulating layer 7b by the patterning processing described above. A mask having an opening in register with the pattern of the land unit 9 is then formed on the third unit wiring layer 7. A thin metal film then is formed on the third unit wiring layer 7, so as to overlie the formed mask, using a thin film forming technique, such as sputtering, CVD or plating. This thin metal film is formed by electrically conductive metal, such as copper. The thin metal film is applied for overlying both the entire surface of the third unit wiring layer 7 provided with the mask and the mask opening. The mask formed on the third unit wiring layer 7 is then removed along with the thin metal film formed thereon. This forms the land unit 9, electrically connected to the third pattern conductor 7a, on the third unit wiring layer 7.

The above forms the circuit unit 2 on the major surface 30a of the dummy substrate 30. Although the three first unit wiring layers are provided in the circuit unit 2, this is not limitative, such that, for example, four or more unit wiring layers may be provided by repeating the manufacturing process for the first unit wiring layer 5.

Figure 7:
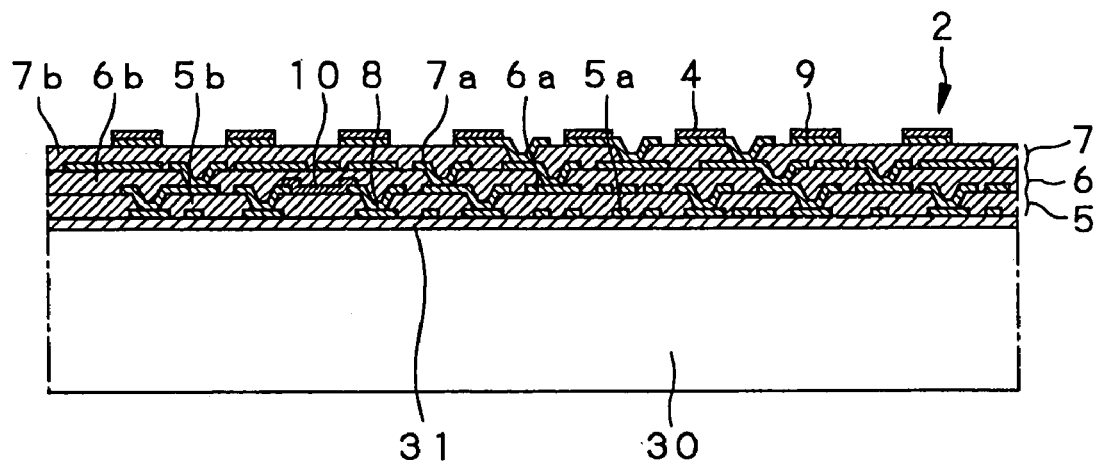
FIG. 7, illustrating the manufacturing process of the circuit substrate device, is a longitudinal cross-sectional view showing a bump unit formed on the third unit wiring layer.

In the circuit unit 2, a bump unit 4, such as of solder, is formed on each land unit 9, as shown in FIG. 7. This bump unit 4 operates as an electrical conducting unit when the circuit unit 2 is connected to the multi-layer wiring substrate 3. The bump unit may be formed as a nickel/copper plating layer by for example electrolytic plating or electroless plating. Since the dummy substrate 30 is used as the supporting substrate, the circuit unit 2 is freed of flexure, such that the bump unit 4 may be formed to high accuracy on the land unit 9.

Figure 8:
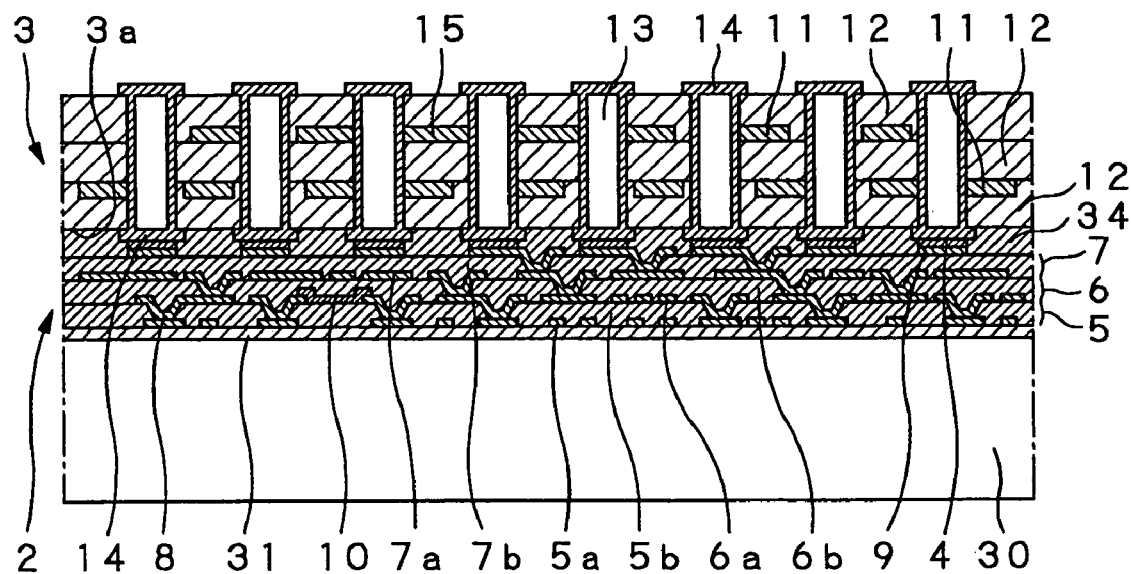
FIG. 8, illustrating the manufacturing process of the circuit substrate device, is a longitudinal cross-sectional view showing a state in which a multi-layer wiring substrate has been connected to the wiring unit.

Referring to FIG. 8, the circuit unit 2 is connected to the major surface of the multi-layer wiring substrate 3 where the connection terminals 14 are exposed, with the surface of the circuit unit 2 where the land unit 9 is exposed. The multi-layer wiring substrate 3 includes a plural number of wiring layers 11 having intra-layer grounding portions 15, and includes the connection terminals 14 exposed in the major surface 3a mounting the circuit unit 2. This major surface 3a is referred to below as a connection surface or a bonding surface. This multi-layer wiring substrate 3 is formed by a manufacturing process for producing e.g., routine RF substrates.

The circuit unit 2 is connected to the multi-layer wiring substrate 3 by being electrically connected through the bump unit 4 to the connection terminals 14 exposed at the connection surface 3a of the multi-layer wiring substrate 3. Specifically, an under-filler 34 is charged into a space between the circuit unit 2 and the multi-layer wiring substrate 3, with the bump unit 4 facing the connection terminals 14. The connection terminals 14 are electrically connected to the bump units 4 by heating the resulting assembly in for example a solder re-flow tank, thereby connecting the circuit unit 2 to the connection surface 3a of the multi-layer wiring substrate 3.

Figure 9:
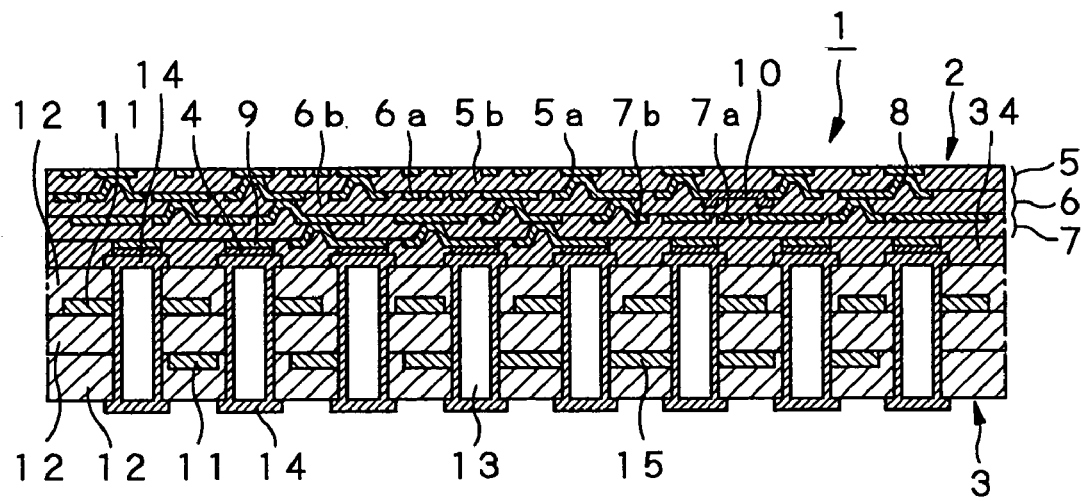
FIG. 9, illustrating the manufacturing process for the circuit substrate device, is a longitudinal cross-sectional view showing a manufactured circuit substrate device.

The dummy substrate 30 then is removed from the circuit unit 2 along with the release layer 31, as shown in FIG. 9. Specifically, the dummy substrate 30 and the release layer 31 are immersed, along with the circuit unit 2, in an acidic solution of, for example, hydrochloric acid or nitric acid. The acidic solution is intruded into a space between the metal film and the resin film, as it slightly dissolves the metal film of the release layer 31, so that the metal layer is progressively peeled off from the resin film, until the dummy substrate 30 is removed while the resin film is left on the major surface of the circuit unit 2 facing the first pattern conductor 5a of the first unit wiring layer 5. The resin film, left on the major surface of the circuit unit 2, is removed by for example a dry etching method, using an oxygen plasma, as an example. The dummy substrate 30 and the release layer 31 are removed in this manner from the circuit unit 2. A protective layer, for example, may also be formed in advance on the surface of the multi-layer wiring substrate 3 opposite to its major surface 3a. The dummy substrate 30 may also be removed from the circuit unit 2 by for example laser ablation processing. This completes the circuit substrate device 1 composed of the circuit unit 2 and the multi-layer wiring substrate 3.

In the circuit substrate device 1, prepared as described above, in which the circuit unit 2 is formed through the release layer 31 on the major surface 30a of the dummy substrate 30, having a highly flattened out surface, and in which the circuit unit 2, having the pattern conductors 5a to 7a by the thin film forming technique, or the passive element unit 9, is first formed on the major surface 3a of the multi-layer wiring substrate 3, and subsequently the dummy substrate 30 and the release layer 31 are both removed, it becomes possible to suppress the warping or inundations in the thickness direction of the circuit unit 2.

Thus, with the present circuit substrate device 1, in which the circuit unit 2 having the pattern conductors 5a to 7a are formed to high density and accuracy with a fine line width as a result of suppression of the warping or inundations along the thickness of the circuit unit 2, and also having passive element units 9 free of dimensional errors, may be formed on the major surface 3a of the multi-layer wiring substrate 3, the electrical or high frequency characteristics may be improved, while the size of the device may also be reduced.

In the manufacturing method of the circuit substrate device 1, the dummy substrate 30, removed from the circuit unit 2, may be re-used at the time of forming the circuit unit 2, so that production cost may be lowered.

In a method for producing the present circuit substrate device 1, the circuit unit 2 may be subjected to an inspection step of executing a shorting test, a line breakage test or an appearance test, by an inspecting device, such as AIO (automatic optical inspector) or visual check, after forming the circuit unit 2 on the dummy substrate 30. These tests are carried out for checking whether or not the pattern conductors 5a to 7a of the circuit unit 2 are formed to proper patterns. With the method for producing the circuit substrate device 1, in which the circuit unit 2 is subjected to the inspection step, whereby the multi-layer wiring substrate 3 may be connected only to the circuit unit 2 on which the pattern conductors 5a to 7a have been formed satisfactorily, so that the inconvenience of connecting the multi-layer wiring substrate 3 to the defective circuit unit 2 may be eliminated to improve the production efficiency.

Figure 10:
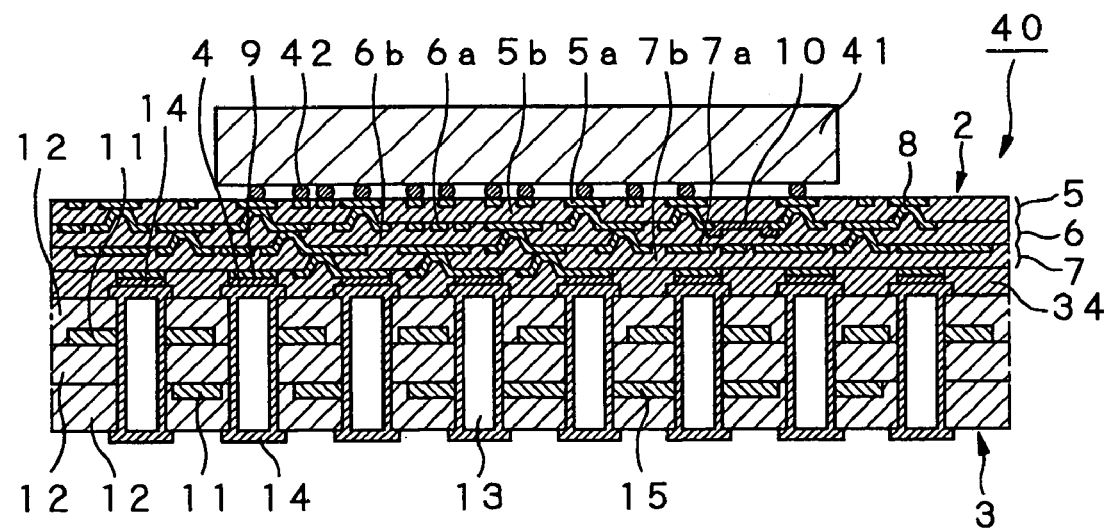
FIG. 10 is a longitudinal cross-sectional view showing the semiconductor device.

This circuit substrate device 1 may also be used as a substrate of a semiconductor device 40, as shown in FIG. 10. Specifically, the semiconductor device 40 includes a functional element 41, such as a semiconductor chip or an LSI (large-scale integrated circuit), mounted on a major surface of the circuit substrate device 1 towards the circuit unit 2, that is on the major surface of the circuit substrate device 1 on which are exposed the first pattern conductors 5a.

In this semiconductor device 40, the functional element 41 is electrically connected, through bump units 42, to the first pattern conductors 5a of the circuit substrate device 1 by for example a flip chip bonding method. However, in mounting the functional element 41 to the semiconductor device 40, a face-down mounting method, such as TAB (tape automated bonding) or a read beam bonding method, may be used, without limitation to the use of the flip chip bonding method.

In the present semiconductor device 40, comprised of the functional element 41 mounted to the circuit substrate device 1, the operation and results similar to those with the circuit substrate device 1 may be achieved. Specifically, with the semiconductor device 40, the functional element 41 is mounted on the circuit substrate device 1, carrying the pattern conductors 5a to 7a, formed by an extremely fine line width to high density and accuracy, and by the passive element unit 9, free of dimensional errors, electrical or high frequency characteristics may be improved, while the device size may be reduced.

Figure 11:
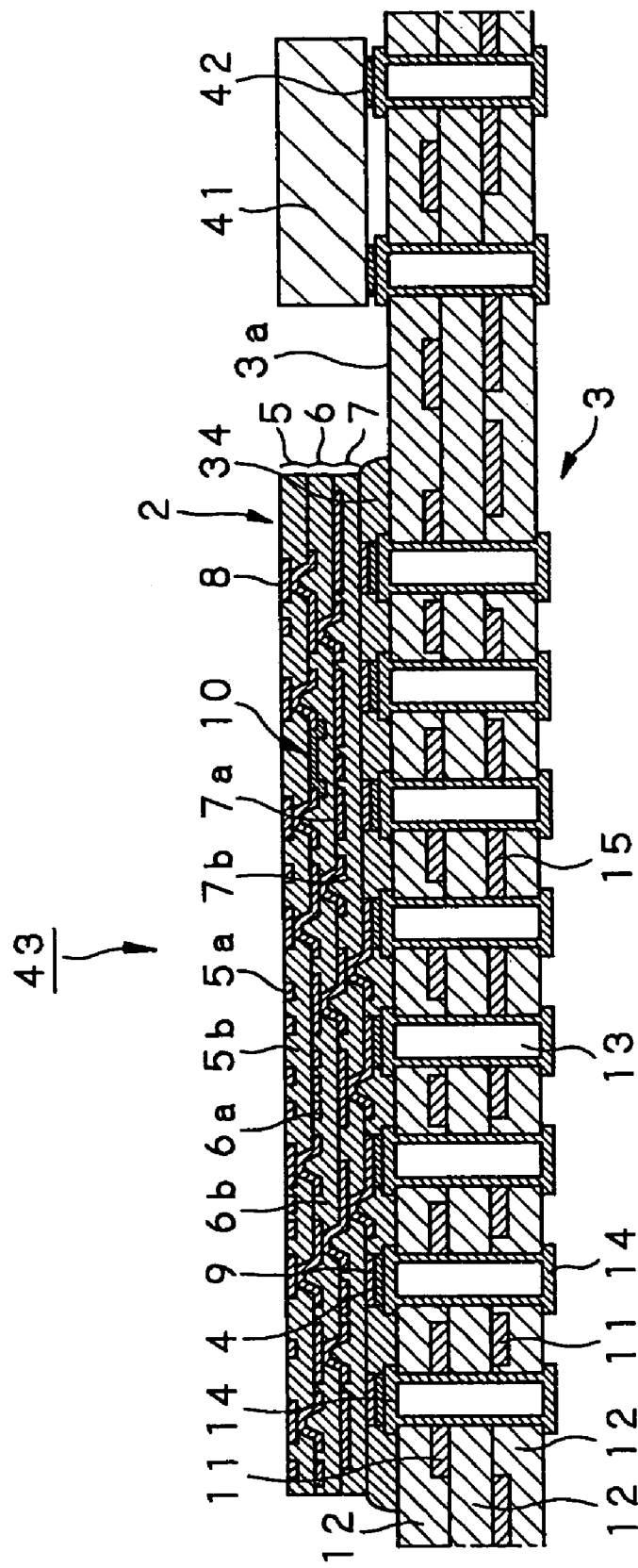
FIG. 11 is a longitudinal cross-sectional view showing another illustrative structure of the semiconductor device.

The foregoing embodiment is relative to a semiconductor device 40 comprised of the functional element 41 mounted to the circuit unit 2, this is not limitative, such that a semiconductor device 43 comprised of the functional element mounted to the circuit substrate device 1 may also be used, as shown in FIG. 11.

In this semiconductor device 43, the multi-layer wiring substrate 3 of the circuit substrate device 1 is larger in size than the circuit unit 2 to reduce its thickness. Specifically, with the semiconductor device 43, the area of the major surface 3a of the multi-layer wiring substrate 3 in the circuit substrate device 1, to which the circuit unit 2 is connected, is set so as to be larger than the area of the circuit unit 2 where the multi-layer wiring substrate 3 is connected.

Thus, with the semiconductor device 43, it is possible to connect the circuit unit 2 to the major surface 3a of the multi-layer wiring substrate 3 and to mount the functional element 41 to the same major surface 3a to which is connected the circuit unit 2. Thus, the present semiconductor device 43 may be reduced in thickness as compared to the case where the functional element 41 is mounted to the circuit unit 2.

In the foregoing, the method for manufacturing the circuit substrate device 1 has been explained in detail as a first embodiment. However, the circuit substrate device 1 may also be manufactured by manufacturing methods by second to fourth embodiments as now explained.

As a second embodiment of the present invention, a circuit substrate device 50, manufactured by a method different from the method of the first embodiment, is now explained in detail with reference to FIG. 12. It is noted that, in the present second embodiment, when the process steps, materials or components, which are the same as those used in the first embodiment for producing the circuit substrate device 1 of the first embodiment, these steps or components are depicted by the same reference numerals and are not explained specifically.

Figure 12A:
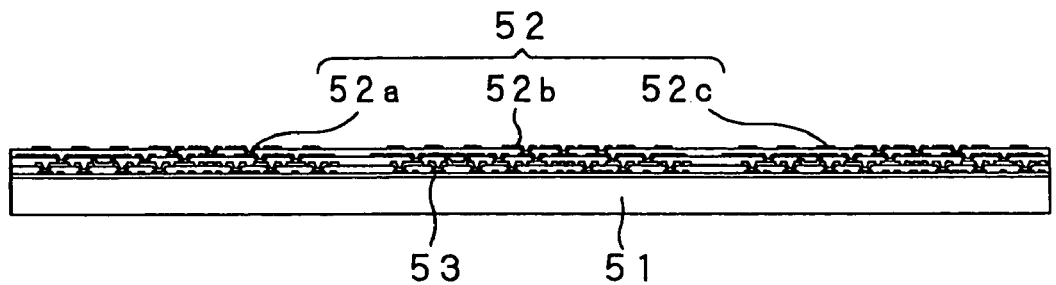
FIGS. 12A to 12C show a modified manufacturing process for the circuit substrate device FIG. 12A being a longitudinal cross-sectional view showing the state in which a set of circuits have been formed on a dummy substrate, FIG. 12B being a longitudinal cross-sectional view showing the splitting process, FIG. 12C being a longitudinal cross-sectional view showing the state in which a multi-layer wiring substrate has been connected to a circuit unit, and FIG. 12D being a longitudinal cross-sectional view showing the manufactured circuit substrate device.

When the circuit substrate device 50 is produced by the manufacturing method of the present second embodiment, a set of circuits 52, namely circuit units 52a to 52c, are formed on a dummy substrate 51 with the interposition of a release layer 53, by a process similar to that for the circuit unit 2 in the above-described first embodiment, as shown in FIG. 12A. For the dummy substrate 51, the same material as that used for the dummy substrate 30 used in the first embodiment is used. The release layer 53 is formed of the same materials as those for the release layer 31 used in the first embodiment.

The set of circuits 52, formed on the dummy substrate 51, is comprised of a plural number of circuit units 2 arrayed on the dummy substrate 51. The circuit units 52a to 52c of the set of circuits 52 are arrayed in tandem or in a checkerboard pattern. In the set of circuits 52, it is possible to divide the patterns of the pattern conductors 5a to 7a into plural patterns to form plural patterns on the dummy substrate 51. In this manner, plural different circuit units 52a to 52c with different patterns of the pattern conductors 5a to 7a may be formed on the dummy substrate 51 in a lump as a unitary structure. Meanwhile, in the present embodiment, the set of circuits 52 is composed of the three circuit units 52a to 52c unified together. This, however, is not limitative, such that the number of the circuit units may be more than three, it being sufficient that a plural number of the circuit units are unified together.

Each of the circuit units 52a to 52c of the set of circuits 52 is subjected to an inspection process similar to that of the first embodiment described above. Thus, it is determined whether or not the pattern conductors 5a to 7a of the circuit units 52a to 52c are properly patterned.

Figure 12B:
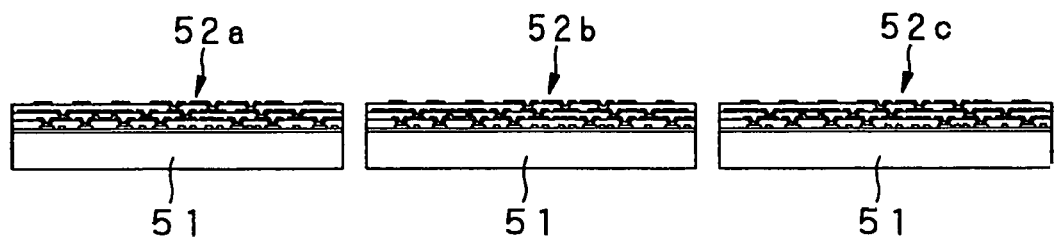

The set of circuits 52 then is subjected to a splitting process of splitting the set of circuits, formed on the dummy substrate 51, into the circuit units 52a to 52c, as shown in FIG. 12B. These circuit units 52a to 52c are then subjected to a sorting process. Specifically the sorting process accepts the circuit units having proper patterns and discards the other circuits so as not to permit these other circuits to proceed to the downstream side process. This prohibits the pattern conductors 5a to 7a having defective pattern conductors 5a to 7a from being connected to the multi-layer wiring substrate 3.

Figure 12C:
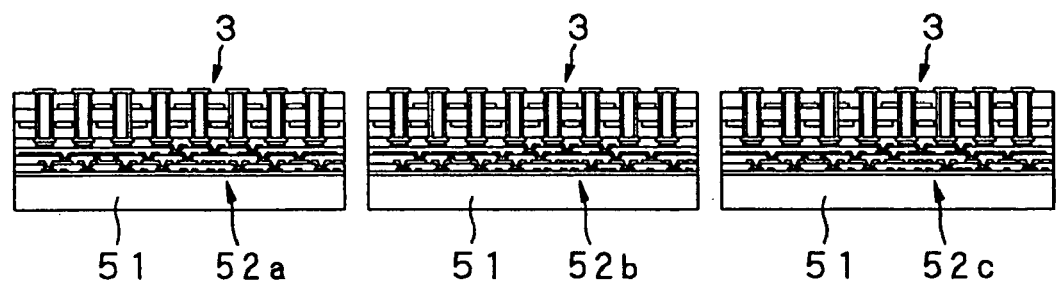
Figure 12D:
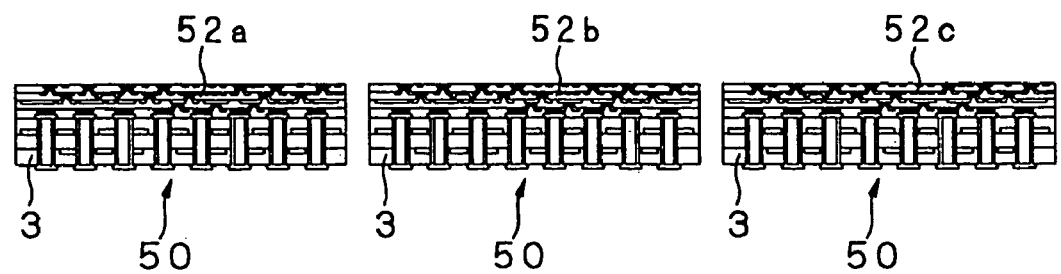

The accepted circuit units 52a to 52c are connected, as shown in FIG. 12C, to the multi-layer wiring substrate 3, as in the first embodiment described above. The circuit units 52a to 52c, to which has been connected the multi-layer wiring substrate 3, are freed of the dummy substrate 51 and the release layer 53, as shown in FIG. 12D, as in the above-described embodiment, to complete the circuit substrate device 50.

With the circuit substrate device 50, produced by the manufacturing method of the second embodiment, the operation and results similar to those of the circuit substrate device 1, manufactured by the method of the first embodiment, may be realized. Specifically, with the circuit substrate device 50, the pattern conductors 5a to 7a, having fine line widths formed to high density and accuracy as a result of suppression of the warping or inundations in the thickness direction, and the circuit units 52a to 52c, having passive element unit 9 free of dimensional errors, may be formed on the major surface 3a of the multi-layer wiring substrate 3, thus improving the electrical characteristics and high frequency response and allowing the size of the device to be reduced.

Moreover, with the manufacturing method of the circuit substrate device 50, the multi-layer wiring substrate is not connected to the circuit units, found to be defective as to the pattern conductors 5a to 7a thereof during the inspection process, and the plural circuit units 52a to 52c are formed in a lump, so that the manufacture time may be further reduced, while improved production efficiency and reduced production costs may be achieved.

Referring to the drawings, a circuit substrate device 60 of a third embodiment of the present invention, shown in FIG. 13, manufactured by a method different from the manufacturing method of the above-described first embodiment, is now explained. It is noted that, in the present third embodiment, when the process steps, materials or components, which are the same as those used in the first embodiment for producing the circuit substrate device 1 of the first embodiment, are used, these steps or components are depicted by the same reference numerals and are not explained specifically.

Figure 13A:
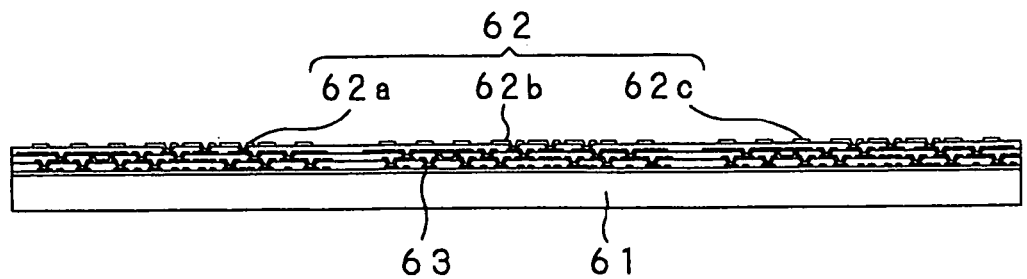
FIGS. 13A to 13D show a modified manufacturing process for the circuit substrate device, FIG. 13A being a longitudinal cross-sectional view showing the state in which a set of circuits have been formed on the dummy substrate, FIG. 13B being a longitudinal cross-sectional view showing the state in which a multi-layer wiring substrate has been bonded to the circuit unit, FIG. 13C being a longitudinal cross-sectional view showing the state in which the dummy substrate has been removed and FIG. 13D being a longitudinal cross-sectional view showing the manufactured circuit substrate device.

When the circuit substrate device 60 is produced by the manufacturing method of the present third embodiment, a set of circuits 62, namely circuit units 62a to 62c, are formed on a dummy substrate 61 with the interposition of release layer 63, by a process similar to that for the circuit unit 2 in the above-described first embodiment, as shown in FIG. 13A. For the dummy substrate 61, the same material as that used for the dummy substrate 30 used in the first embodiment is used. The release layer 63 are formed of the same materials as those for the release layer 31 used in the first embodiment.

The set of circuits 62, formed on the dummy substrate 61, is comprised of a plural number of circuit units 2 arrayed on the dummy substrate 61, as in the case of the set of circuits 52 of the above-described circuit substrate device 50. The circuit units 62a to 62c of the set of circuits 62 are arrayed in tandem or in a checkerboard pattern. In the set of circuits 62, it is similarly possible to divide the patterns of the pattern conductors 5a to 7a of the circuit units 62a to 62c into plural patterns to form plural patterns on the dummy substrate 61. In this manner, plural different circuit units 62a to 62c with different patterns of the pattern conductors 5a to 7a may be formed on the dummy substrate 61 in a lump as a unitary structure. Meanwhile, in the present embodiment, the set of circuits 62 is composed of the three circuit units 62a to 62c. This, however, is not limitative, such that the number of the circuit units may be more than three, it being sufficient that a plural number not less than three of the circuit units are unified together.

Figure 13B:
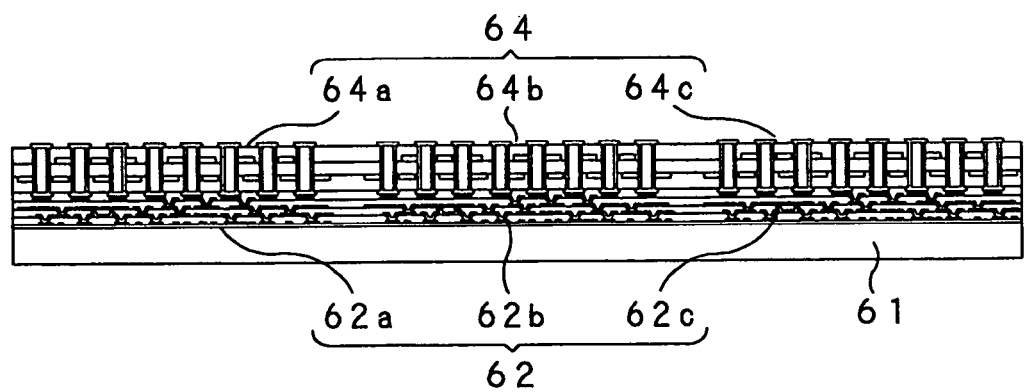

To the set of circuits 62, formed on the dummy substrate 61, a set of multi-layered substrates 64, composed of an array of plural multi-layer wiring substrates 64a to 64c, unified together, is connected, with these multi-layer wiring substrates facing a plural number of circuit units 62a to 62c of the set of circuits 62, as shown in FIG. 13B. Specifically, the circuit units 62a to 62c are electrically connected to the multi-layer wiring substrates 64a to 64c lying in a facing relationship thereto. Meanwhile, the set of multi-layered substrates 64 is produced by the manufacturing process used for producing e.g., FR substrates, as in the above-described first embodiment. The multi-layer wiring substrates 64a to 64c of the set of multi-layered substrates 64 are of the same material and the same structure as those of the multi-layer wiring substrate 3.

Figure 13C:
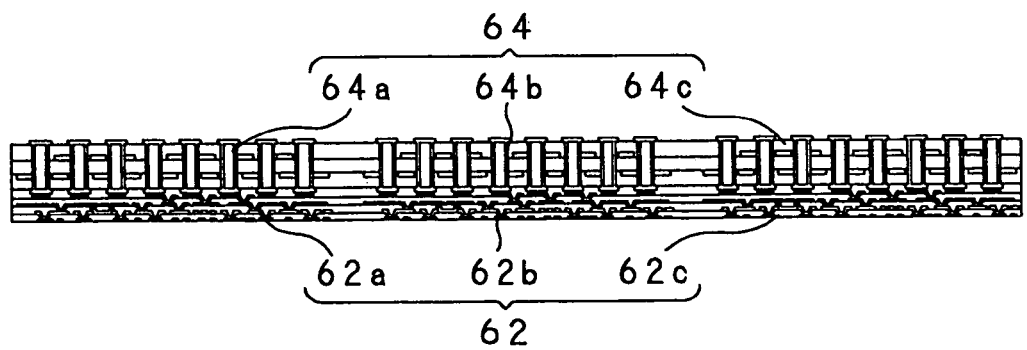
Figure 13D:
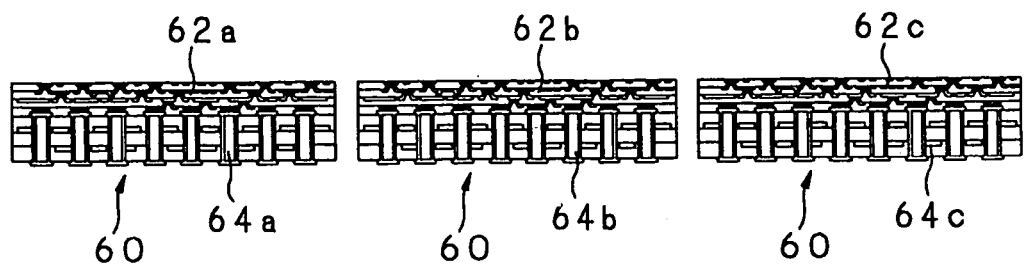

The set of circuits 62, connected to the set of multi-layered substrates 64, is freed of the dummy substrate 61 and the release layer 63, in the same way as in the above-described first embodiment, as shown in FIG. 13C. The set of circuits 62 and the set of multi-layered substrates 64, freed of the dummy substrate 61 and the release layer 63, in the same way as in the above-described first embodiment, is subjected to a splitting process of splitting into the circuit units 62a to 62c, along with the multi-layer wiring substrates 64a to 64c, as shown in FIG. 13D. In this manner, a plural number of the circuit substrate device 60 may be produced in a lump.

With the circuit substrate device 60, produced by the manufacturing method of the third embodiment, the operation and results similar to those of the circuit substrate device 1, manufactured by the method of the first embodiment, may be realized. Specifically, with the circuit substrate device 60, the pattern conductors 5a to 7a, having fine line widths formed to high density and accuracy as a result of suppression of the warping or inundations in the thickness direction, and the circuit units 62a to 62c, having passive element unit 9 free of dimensional errors, may be formed on multi-layer wiring substrates 64a to 64c, thus improving the electrical characteristics and high frequency response and allowing the size of the device to be reduced.

Moreover, with the manufacturing method of the circuit substrate device 60, the circuit substrate device 60 may be formed in a lump, so that the manufacture time may be further reduced, while improved production efficiency and reduced production costs may be achieved. Additionally, with the manufacturing method of the circuit substrate device 60, the circuit substrate device 60, the dummy substrate 61 may be separated from the set of circuits 62 without being split and hence may be re-used, thus reducing the cost.

Referring to the drawings, a circuit substrate device 70 of a fourth embodiment of the present invention, shown in FIG. 14, manufactured by a method different from the manufacturing method of the above-described first embodiment, is now explained. It is noted that, in the present fourth embodiment, when the process steps, materials or components, which are the same as those used in the first embodiment for producing the circuit substrate device 1 of the first embodiment, are used, these steps or components are depicted by the same reference numerals and are not explained specifically.

Figure 14A:
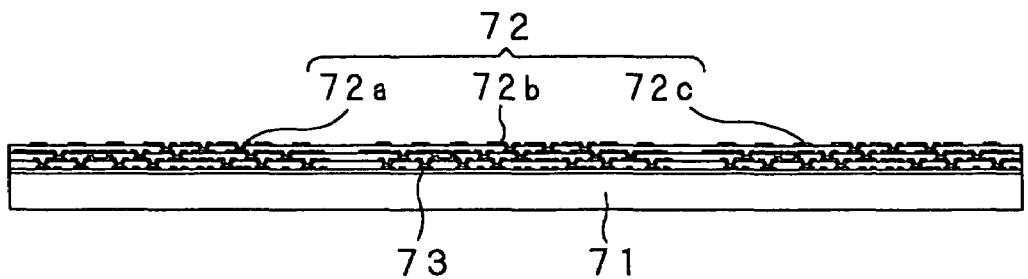
FIGS. 14A to 14D show a modified manufacturing process for the circuit substrate device, FIG. 14A being a longitudinal cross-sectional view showing the state in which a set of circuits have been formed on the dummy substrate, FIG. 14B being a longitudinal cross-sectional view showing the state in which a multi-layer wiring substrate has been selectively connected to the circuit unit, FIG. 14C being a longitudinal cross-sectional view showing the state in which the dummy substrate has been removed and FIG. 14D being a longitudinal cross-sectional view showing the manufactured circuit substrate device.

When the circuit substrate device 70 is produced by the manufacturing method of the present fourth embodiment, a set of circuits 72, namely circuit units 72a to 72c, are formed on a dummy substrate 71, with the interposition of release layer 73, by a process similar to that for the circuit unit 2 in the above-described first embodiment, as shown in FIG. 14A. For the dummy substrate 71, the same material as that used for the dummy substrate 30 used in the first embodiment is used. The release layer 73 are formed of the same material as that for the release layer 31 used in the first embodiment.

The set of circuits 72, formed on the dummy substrate 71, is comprised of a plural number of circuit units 2, arrayed on the dummy substrate 71, as in the case of the set of circuits 52 of the above-described circuit substrate device 50. The circuit units 72a to 72c of the set of circuits 72 are arrayed in tandem or in a checkerboard pattern. In the set of circuits 72, it is possible to divide the patterns of the pattern conductors 5a to 7a of the circuit units 72a to 72c into plural patterns to form these plural patterns on the dummy substrate 71. In this manner, plural different circuit units 72a to 72c with different patterns of the pattern conductors 5a to 7a, may be formed on the dummy substrate 71 in a lump as a unitary structure. Meanwhile, in the present embodiment, the set of circuits 72 is composed of the three circuit units 72a to 72c. This, however, is not limitative, such that the number of the circuit units may be more than three, it being sufficient that a plural number not less than three of the circuit units are unified together.

Each of the circuit units 72a to 72c of the set of circuits 72 is subjected to an inspection process similar to that of the first embodiment described above. Thus, it is determined whether or not the pattern conductors 5a to 7a of the circuit units 72a to 72c are properly patterned.

Figure 14B:
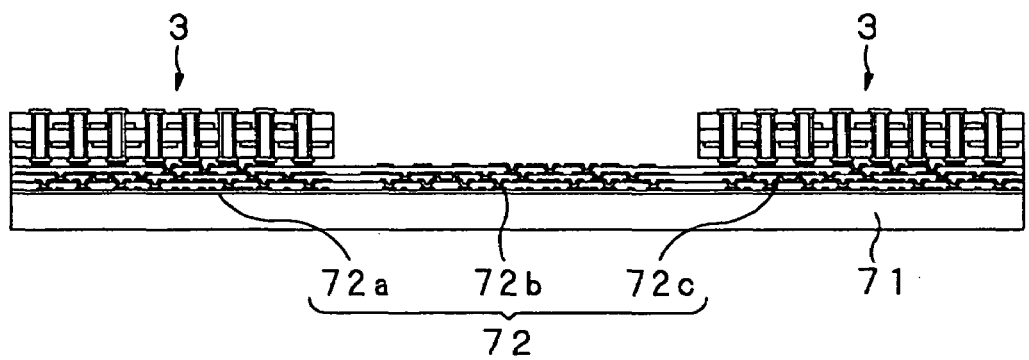

Of the plural circuit units 72a to 72c, unitarily formed on the dummy substrate 51, only those found in the inspection process as having the pattern conductors 5a to 7a thereof properly formed are connected to the multi-layer wiring substrate 3, in the same way as in the above-described first embodiment, as shown in FIG. 14B. In the following explanation, it is assumed that the pattern conductors 5a to 7a of the circuit units 72a and 72c, of the circuit units 72a to 72c, are found to be properly formed, while the pattern conductors 5a to 7a of the circuit unit 72b are found to be defective.

Figure 14C:
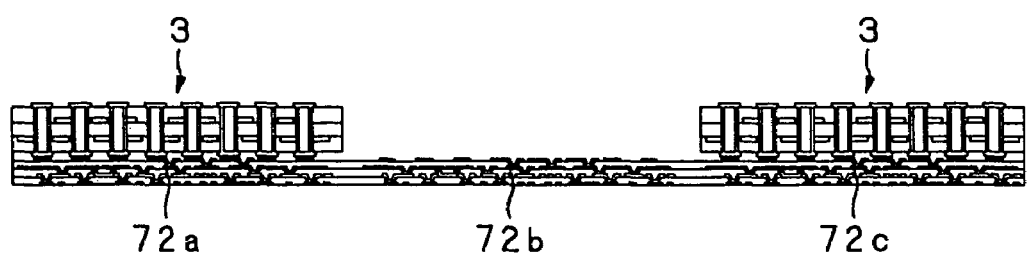
Figure 14D:
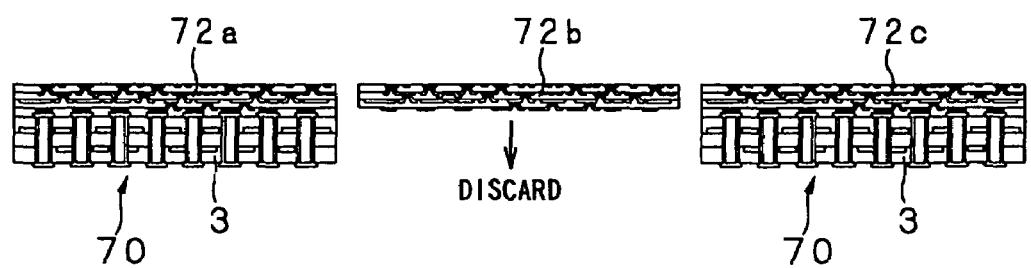

The set of circuits 72, to which has been connected the multi-layer wiring substrate 3, is freed of the dummy substrate 71 and the release layer 73, in the same way as in the above-described first embodiment, as shown in FIG. 14C. The set of circuits 72, freed of the dummy substrate 71, is subjected to the splitting process of splitting into the circuit units 72a to 72c, with the multi-layer wiring substrate 3 attached thereto, whereby the circuit substrate devices 70 may be produced in a lump, as shown in FIG. 14D. The circuit unit 72b, the pattern conductors 5a to 7a of which have been found in the inspection process to be defective, and to which the multi-layer wiring substrate 3 has not been attached, is discarded after the splitting process.

With the circuit substrate device 70, produced by the manufacturing method of the fourth embodiment, the operation and results similar to those of the circuit substrate device 1, manufactured by the method of the first embodiment, may be realized. Specifically, with the circuit substrate device 70, the pattern conductors 5a to 7a, having fine line widths formed to high density and accuracy as a result of suppression of the warping or inundations in the thickness direction, and the circuit units 72a to 72c, having passive element unit 9 free of dimensional errors, may be formed on the multi-layer wiring substrate 3, thus improving the electrical characteristics and high frequency response and allowing the size of the device to be reduced.

Additionally, with the method for producing the circuit substrate device 70, the circuit unit, the pattern conductors 5a to 7a of which have been found to be defective in the inspection process, may be prevented from being connected to the multi-layer wiring substrate 3, thus further improving the yield and reducing the cost. Moreover, with the method for producing the circuit substrate device 70, since the circuit substrate devices 70 may be produced in a lump, the production time may be further reduced, while the production efficiency may also be further improved. With the method for producing the circuit substrate device 70, the dummy substrate 71 may be removed from the set of circuits 72 without being split, and hence may be re-used, thus further lowering the cost.

With the circuit substrate devices, produced in accordance with the second to fourth embodiments, the functional element 41 may be mounted thereto, so that the circuit substrate devices may be used as substrates for the semiconductor device 40.

While the invention has been described in accordance with certain present embodiments thereof illustrated in the accompanying drawings and described in the above description in detail, it should be understood by those ordinarily skilled in the art that the invention is not limited to the embodiments, but various modifications, alternative constructions or equivalents can be implemented without departing from the scope and the spirit of the present invention as set forth and defined in the appended claims.

What is claimed is:

1. A method for producing a circuit substrate device comprising:
    a circuit unit forming step of forming a circuit unit over a dummy substrate with a release layer between the circuit unit and the dummy substrate, said circuit unit having one or more wiring layers each having a pattern conductor formed by a thin film technique, and an insulating layer, said circuit unit also having a land unit, on an uppermost layer of said wiring layer(s), said land unit connecting to said pattern conductor;
    a substrate forming step of forming a multi-layer wiring substrate including a connecting portion exposed from a major surface thereof;
    a bonding step of connecting said circuit unit to the major surface of said multi-layer wiring substrate for connecting said land unit to said connecting portion; and
    a removing step of removing said dummy substrate and said release layer by releasing said release layer from said circuit unit.

2. The method for producing a circuit substrate device according to claim 1 wherein, subsequent to the circuit unit forming step, an inspection step of executing preset inspection is carried out for verifying whether or not said pattern conductors have been formed properly in said circuit unit.

3. The method for producing a circuit substrate device according to claim 1 wherein, in said bonding step, said circuit unit is bonded to said multi-layer wiring substrate in such a manner that the area of a surface of said multi-layer wiring substrate connected to said circuit unit is larger than an area of a surface of said circuit unit connected to said multi-layer wiring substrate.

4. A method for producing a circuit substrate device comprising:
    a circuit set forming step of forming a set of circuits, comprised of a plurality of circuit units arrayed side by side over a dummy substrate, a release layer provided between the circuit units and the dummy substrate, each circuit unit having one or more wiring layers each having a pattern conductor formed by a thin film technique, and an insulating layer, said circuit unit also having a land unit, on an uppermost layer of said wiring layer(s), said land unit connecting to said pattern conductor;

an inspecting step of subjecting said set of circuits to preset inspection as to whether or not said pattern conductor has been properly formed, from one circuit unit to another;

a splitting step of splitting said dummy substrate and said set of circuits, as said set of circuits has been formed on said dummy substrate, from one circuit unit to another;

a sorting step of accepting only the circuit unit the pattern conductor of which has been found in said inspecting step to have been formed properly;

a substrate forming step of forming a multi-layer wiring substrate including a connecting portion exposed from a major surface thereof;

a bonding step of bonding said circuit unit, accepted in said inspecting step, to the major surface of said multi-layer wiring substrate so that said land unit is bonded to the major surface of said multi-layer wiring substrate; and a removing step of removing said dummy substrate and the release layer by peeling at said release layer from said circuit unit.

5. The method of producing a circuit substrate device according to claim 4 wherein, in said circuit set forming step, the pattern conductors are formed to different plural patterns from one circuit unit to another.

6. The method of producing a circuit substrate device according to claim 4 wherein, in said bonding step, said circuit unit is bonded to said multi-layer wiring substrate in such a manner that the area of a surface of said multi-layer wiring substrate connected to said circuit unit is larger than an area of a surface of said circuit unit connected to said multi-layer wiring substrate.

7. A method for producing a circuit substrate device comprising:
a circuit set forming step of forming a set of circuits, comprised of a plurality of circuit units arrayed side by side over a dummy substrate, a release layer provided between the circuit units and the dummy substrate, each circuit unit having one or more wiring layers each having a pattern conductor formed by a thin film technique, and an insulating layer, said circuit unit also having a land unit, on an uppermost layer of said wiring layer(s), said land unit connecting to said pattern conductor;

a substrate set forming step of forming a set of a plurality of multi-layer wiring substrates arrayed side by side in a facing relationship to said circuit units of said circuit set, each multi-layer wiring substrate including a connecting portion exposed from the major surface thereof;

a bonding step of bonding said circuit set to said substrate set so that the land unit of said circuit unit is connected to the connecting portion of said multi-layer wiring substrate lying in a facing relationship to said land unit;

a removing step removing said dummy substrate and the release layer by peeling said release layer from said circuit set; and a splitting step of splitting said circuit set and the substrate set in a lump, as said circuit set and the substrate set are bonded to each other, from one circuit unit to another.

8. The method for producing a circuit substrate device according to claim 7 wherein, in said circuit set forming step, the pattern conductors are formed to different plural patterns from one circuit unit to another.

9. A method for producing a circuit substrate device comprising:
a circuit set forming step of forming a set of circuits, comprised of a plurality of circuit units arrayed side by side over a dummy substrate, a release layer provided between the circuit units and the dummy substrate, each circuit unit having one or more wiring layers each having a pattern conductor formed by a thin film technique, and an insulating layer, said circuit unit also having a land unit, on an uppermost layer of said wiring layer(s), said land unit connecting to said pattern conductor, an inspecting step of subjecting said set of circuits to preset inspection as to whether or not said pattern conductor has been properly formed, from one circuit unit to another;

a substrate forming step of forming a multi-layer wiring substrate including a connecting portion exposed from a major surface thereof;

a bonding step of bonding said multi-layer wiring substrate only to the circuit unit, the pattern conductor of which has been found in said inspecting step to have been formed properly, so that said land unit is connected to said connecting portion;

a removing step of removing said dummy substrate and the release layer so that said release layer is peeled from said circuit set; and a splitting step of splitting said circuit set into said circuit units as said multi-layer wiring substrate is attached thereto.

10. The method for producing a circuit substrate device according to claim 9 wherein, in said circuit set forming step, the pattern conductors are formed to different plural patters from one circuit unit to another.

11. A method for producing a semiconductor device comprising:
a circuit substrate unit forming step of forming a circuit substrate unit by a circuit unit forming step of forming a circuit unit over a dummy substrate with a release layer between the circuit unit and the dummy substrate, said circuit unit having one or more wiring layers each having a pattern conductor formed by a thin film technique, and an insulating layer, said circuit unit also having a land unit, on an uppermost layer of said wiring layer(s), said land unit connecting to said pattern conductor, a substrate forming step of forming a multi-layer wiring substrate including a connecting portion exposed from a major surface thereof, a bonding step of bonding said circuit unit to the major surface of said multi-layer wiring substrate for connecting said land unit to said connection portion, and a removing step of removing said dummy substrate and said release layer by releasing said release layer from said circuit unit; and a mounting step of electrically connecting said pattern conductor to a semiconductor chip for mounting said semiconductor chip.

12. The method for producing a semiconductor device according to claim 11 wherein, in said circuit substrate forming step, an inspecting step of subjecting said circuit unit, after said circuit unit forming step, to preset inspection as to whether or not said pattern conductor has been formed properly, from one circuit unit to another.

13. The method for producing a semiconductor device according to claim 11 wherein, in said bonding step of said circuit substrate forming step, said circuit unit is bonded to said multi-layer wiring substrate in such a manner that the area of a surface of said multi-layer wiring substrate connected to said circuit unit is larger than an area of said circuit unit connected to said multi-layer wiring substrate.

14. A method for producing a semiconductor device comprising:

a circuit substrate forming step of forming a circuit substrate by a circuit set forming step of forming a set of circuits, comprised of a plurality of circuit units arrayed side by side over a dummy substrate, a release layer provided between the circuit units and the dummy substrate, each circuit unit having one or more wiring layers each having a pattern conductor formed by a thin film technique, and an insulating layer, said circuit unit also having a land unit, on an uppermost layer of said wiring layer(s), said land unit connecting to said pattern conductor, an inspecting step of subjecting said set of circuits to preset inspection as to whether or not said pattern conductor has been properly formed, from one circuit unit to another, a splitting step of splitting said dummy substrate, and said set of circuits as said set of circuits has been formed on said dummy substrate, from said circuit unit to another, a sorting step of accepting only the circuit set the pattern conductor of which has been found in said inspecting step to have been formed properly, a substrate forming step of forming a multi-layer wiring substrate including a connecting portion exposed from a major surface thereof, a bonding step of bonding said circuit unit, accepted in said inspecting step, to the major or surface of said multi-layer wiring substrate so that said land unit is bonded to said connecting portion, and a removing step removing said dummy substrate and the release layer by peeling at said release layer; and a mounting step of mounting said semiconductor chip on said circuit substrate by electrically connecting said pattern conductor to said semiconductor chip.

15. The method for producing a semiconductor device according to claim 14 wherein the pattern conductors are formed to different plural patterns from one circuit unit to another.

16. The method for producing a semiconductor device according to claim 14 wherein, in said bonding step of said circuit substrate forming step, said circuit unit is bonded to said multi-layer wiring substrate in such a manner that the area of a surface of said multi-layer wiring substrate connected to said circuit unit is larger than an area of said circuit unit connected to said multi-layer wiring substrate.

17. A method for producing a semiconductor device comprising:

a circuit substrate forming step of forming a circuit substrate by a circuit set forming step of forming a set of circuits, comprised of a plurality of circuit units arrayed side by side over a dummy substrate, a release layer provided between the circuit units and the dummy substrate, each circuit unit having one or more wiring layers each having a pattern conductor formed by a thin film technique, and an insulating layer, said circuit unit also having a land unit, on an uppermost layer of said wiring layers, said land unit connecting to said pattern conductor, a substrate set forming step of forming a set of a plurality of multi-layer wiring substrates arrayed side by side in a facing relationship to said circuit units of said circuit set, each multi-layer wiring substrate included a connecting portion exposed from the major surface thereof, a bonding step of bonding said circuit set to said substrate set so that the land unit of said circuit unit is connected to the connecting portion of said multi-layer wiring substrate lying in a facing relationship to said land unit, a removing step removing said dummy substrate and the release layer by peeling at said release layer, and a splitting step of splitting said circuit set and said substrate set in a lump from one circuit unit to another, as said circuit set and the substrate set are bonded to each other, and a mounting step of mounting step semiconductor chip on said circuit substrate by electrically connecting said pattern conductor to said semiconductor chip.

18. The method for producing a semiconductor device according to claim 17 wherein, in said circuit set forming step of said circuit substrate forming step, the pattern conductors are formed to different plural patterns from one circuit unit to another.

19. A method for producing a semiconductor device comprising:

a circuit substrate forming step of forming a circuit substrate by a circuit set forming step of forming a set of circuits, comprised of a plurality of circuit units arrayed side by side over a dummy substrate, a release layer provided between the circuit units and the dummy substrate, each circuit unit having one or more wiring layers each having a pattern conductor formed by a thin film technique, and an insulating layer, said circuit unit also having a land unit, on an uppermost layer of said wiring layers, said land unit connecting to said pattern conductor, an inspecting step of subjecting said set of circuits to preset inspection as to whether or not said pattern conductor has been properly formed, from one circuit unit to another, a substrate forming step of forming a multi-layer wiring substrate including a connecting portion exposed from the major surface, a bonding step of bonding said multi-layer wiring substrate only to the circuit unit the pattern conductor of which has been found in said inspection step to have been formed properly, so that said land is connected to said connecting portion, a removing step removing said dummy substrate and the release layer by peeling said release layer from said circuit set, and a splitting step of splitting said set of circuits, as said set of circuits has been bonded to said multi-layer wiring substrate, into said circuits units; and a mounting step of mounting said semiconductor chip on said circuit substrate by electrically connecting said pattern conductor to said semiconductor chip.

20. The method for producing a semiconductor device according to claim 19 wherein the pattern conductors formed to different plural patterns from one circuit unit to another.

* * * * *